United States Patent [19]

Dutton

[11] Patent Number: 4,608,687

[45] Date of Patent: Aug. 26, 1986

[54] BIT STEERING APPARATUS AND METHOD FOR CORRECTING ERRORS IN STORED DATA, STORING THE ADDRESS OF THE CORRECTED DATA AND USING THE ADDRESS TO MAINTAIN A CORRECT DATA CONDITION

[75] Inventor: Patrick F. Dutton, Endicott, N.Y.

[73] Assignee: International Business Machines Corporation, Armonk, N.Y.

[21] Appl. No.: 531,793

[22] Filed: Sep. 13, 1983

[51] Int. Cl.[4] .............................................. G06F 11/20
[52] U.S. Cl. ........................................ 371/10; 371/13; 371/38
[58] Field of Search ......................................... 371/7–8, 371/10–11, 13, 21, 24–25, 38–41, 67, 70–71; 324/73 R, 73 AT, 73 PC; 365/201

[56] References Cited

U.S. PATENT DOCUMENTS

| | | | |
|---|---|---|---|
| 3,222,653 | 12/1965 | Rice | 364/172.5 |
| 3,633,175 | 1/1972 | Harper | 340/172.5 |
| 3,868,646 | 2/1975 | Bergman | 340/172.5 |
| 4,061,908 | 12/1977 | de Jonge et al. | 371/21 X |
| 4,093,985 | 6/1978 | Das | 364/200 |
| 4,163,147 | 7/1979 | Scheuneman et al. | 371/38 X |
| 4,175,692 | 11/1979 | Watanabe | 371/13 X |
| 4,255,808 | 3/1981 | Schaber | 371/38 |
| 4,296,494 | 10/1981 | Ishikawa et al. | 371/13 |
| 4,310,901 | 1/1982 | Harding et al. | 365/200 |
| 4,317,201 | 2/1982 | Sedalis | 371/38 |
| 4,319,356 | 3/1982 | Kocol et al. | 371/38 |
| 4,371,930 | 2/1983 | Kim | 371/38 X |
| 4,384,348 | 5/1983 | Nozaki | 371/21 X |
| 4,394,763 | 7/1983 | Nagano et al. | 371/38 |
| 4,453,248 | 6/1984 | Ryan | 371/11 |
| 4,456,993 | 6/1984 | Taniguchi et al. | 371/10 |
| 4,471,472 | 9/1984 | Young | 371/10 X |
| 4,475,194 | 10/1984 | La Vallee et al. | 371/10 |
| 4,493,075 | 1/1985 | Anderson et al. | 371/10 |
| 4,506,362 | 3/1985 | Morley | 371/13 |

OTHER PUBLICATIONS

IBM Technical Disclosure Bulletin, article entitled "Dynamic Allocation of Redundant Memory Components", vol. 24, No. 9, Feb. 82, pp. 4776–4778.
IBM Technical Disclosure Bulletin, "Automatic Repair Method", J. P. Roth, vol. 10, No. 7, Dec. 1967, pp. 915–916.

(List continued on next page.)

Primary Examiner—Gary V. Harkcom
Attorney, Agent, or Firm—John H. Bouchard

[57] ABSTRACT

In a computer system, an apparatus detects the existence of an error in data retrieved from memory, corrects the erroneous data, and takes steps to maintain the correct condition of the data. In taking these steps, when the erroneous data is corrected, the corrected data is stored in a spare portion of the memory; however, the address of the corrected data in memory is recorded in a bit steering array, a physically separate memory of much smaller size. The bit steering array stores a plurality of such addresses. When an incoming read request signal is generated, it simultaneously energizes the memory and the bit steering array. In response to the read request signal, the bit steering array develops an output signal indicative of the address of the corrected data and representative of the identity of the erroneous data. In response to the read request signal, data, including the erroneous data, is read from memory. In addition, the corrected data is read from the spare portion of the memory. However, in response to the output signal from the bit steering array, the erroneous data is replaced or exchanged with the corrected data. In the case of a double bit error, one bit is corrected in the manner just described. The other bit is corrected in an error correction code matrix, which is designed to correct single bit errors.

9 Claims, 9 Drawing Figures

U.S. PATENT DOCUMENTS

IBM Technical Disclosure Bulletin, "Effective Scheme for Utilizing Partially Good Chips in Memory System", G. G-C. Liu, vol. 20, No. 8, Jan. 1978, pp. 3009–3010.

IBM Technical Disclosure Bulletin, "Storage Module Reconfiguration to Bypass Bit Failures", W. G. Bouricius, W. C. Carter, J. P. Roth & P. R. Schneider, vol. 11, No. 5, Oct. 1968, pp. 550–551.

IBM Technical Disclosure Bulletin, "Processing System", R. P. Fletcher, vol. 11, No. 5, Oct. 1968, p. 515.

IBM Technical Disclosure Bulletin, "Error Correction by Reconfiguring", J. E. Heasley, Jr., & R. F. McMahon, vol. 10, No. 10, Mar. 1968, pp. 1543–1544.

IBM Technical Disclosure Bulletin, "Logical Deletion of Portions of a Push-Down Algorithm", E. L. Allen, Jr., V. L. Blunk, E. J. Ossolinski & H. G. Weber III, vol. 12, No. 12, May 1970, pp. 2150–2151.

IBM Technical Disclosure Bulletin, "Removal of Failing Buffer Sections in a Buffer-Backing Store", M. W. Bee, W. E. Boehner, J. L. Burk & B. L. McGilvray, vol. 13, No. 2, Jul. 1970, pp. 400–402.

IBM Technical Disclosure Bulletin, "Substitute Memory Location Assignment for Faulty Locations", G. H. Smith & C. H. Wolff, vol. 12, No. 9, Feb. 1970, pp. 1441–1442.

IBM Technical Disclosure Bulletin, "Read-Only Store Patch", R. M. Correy, vol. 16, No. 12, May 1974, pp. 3841–3842.

IBM Technical Disclosure Bulletin, "Permanent Alteration of Control Programs Loaded from Read/Write Disk Stores into Volatile Control Stores", K. L. Kraft, H. H. Lampe, P. Prochazka & P. Rudolph, vol. 15, No. 11, Apr. 1973, pp. 3492–3493.

IBM Technical Disclosure Bulletin, "Read-Only Store Patch", L. Doehle, U. Maier, R. Rank, vol. 24, No. 1A, Jun. 1981, p. 130.

IBM Journal of Research and Development, "Circuit Implementation of Fusible Redundant Addresses on RAM's for Productivity Enhancement", B. F. Fitzgerald & E. P. Thoma, May 1980, pp. 291–298.

IBM Technical Disclosure Bulletin, "Substitute Memory Location Locator", G. H. Smith & C. H. Wolff, vol. 12, No. 9, Feb. 1970, pp. 1443–1444.

BIT STEERING APPARATUS AND METHOD FOR CORRECTING ERRORS IN STORED DATA, STORING THE ADDRESS OF THE CORRECTED DATA AND USING THE ADDRESS TO MAINTAIN A CORRECT DATA CONDITION

BACKGROUND OF THE INVENTION

1. Field of the Invention

The present invention relates to a computer system, and more particularly, to a error sensing and correction apparatus within said computer system for automatically sensing the existence of an error within said computer system, for correcting said error, and for automatically ensuring that said error will never again re-occur.

2. Description of the Prior Art

A memory often includes a plurality of integrated circuit chips. The integrated circuit chips each include a plurality of cells. If one or more cells of an integrated circuit chip in the memory fail, the binary data, stored in the cells, is erroneously changed. When the data is read from the memory, the erroneous binary data is included as part of the data read from memory.

Various schemes have been devised to detect the existence of the erroneous data, to correct the data, and to take steps to ensure that the corrected data will be retrieved from memory when the memory is subsequently addressed. For example, U.S. Pat. No. 3,222,653 to Rice and IBM technical disclosure bulletin Vol. 12, No. 9, February 1970, pages 1441 through 1444 disclose such schemes. In U.S. Pat. No. 3,222,653, if data, withdrawn from a defective location in memory, is determined to be erroneous, the data is corrected and stored in an auxiliary location of the memory. The address of the auxiliary memory location may be stored in a non-defective portion of the defective location in memory wherein the data was originally stored. However, if the defective location in memory, wherein the data was originally stored, is completely defective, the address of the auxiliary memory location and the corresponding address of the defective location in memory are stored in one register in a special section of memory. During a subsequent read of the data stored in the defective location in memory, the integrity of the data must first be checked. An error indicator indicates that the data stored in the defective location in memory is not a data word. The data stored in the defective location in memory may then be interpreted as being the address of the auxiliary memory location wherein the data is actually stored. The auxiliary memory location is addressed at a location corresponding to the data stored in the defective location in memory. As a result, the corrected data is read from the auxiliary location in memory. If the location in memory is completely defective, when the error indicator has indicated that the data stored in the defective location is not a data word, the address of the defective location must be found in the one register of the special section of memory. When the address is found, the address of the auxiliary location in memory is noted. The corrected data is then retrieved from the auxiliary location in memory. A similar functioning occurs with respect to the apparatus disclosed in the above referenced technical disclosure bulletin.

In the patent and the technical disclosure bulletin, during the subsequent read of the data stored in the defective location in memory, the memory must be read twice in order to retrieve the corrected data, a first read being in the defective location, a second read being in the auxiliary location in memory. Since the memory must be read twice, performance problems may occur with respect to the functional operation of the computer system. Furthermore, if the location in memory is completely defective, the memory must be read three times, a first being in the defective location in memory, a second being in the one register of the special section in memory to locate the address of the auxiliary memory location, and a third being in the auxiliary memory location. This may create a performance problem. In addition, in the patent, a read cycle must precede a write cycle in order to determine whether the location in memory, wherein the data is to be stored, is defective. Further performance problems can result from this requirement.

It is noted that the address of the auxiliary memory location, wherein the corrected data is stored, resides in the same memory as that in which the data was originally stored, that is, either in the defective location or in the special section of the memory. As a result, the memory must be read twice or three times to retrieve the corrected data.

A number of additional prior art publications exist.

1. IBM Technical Disclosure Bulletin, "Automatic Repair Method", J. P. Roth, Vol. 10, No. 7, December 1967, pp. 915–916.

2. IBM Technical Disclosure Bulletin, "Allocation of Redundant Memory Components", F. J. Aichelmann, Jr. and L. K. Lange, Vol. 24, No. 9, February 1982, pp. 4776–4778.

3. IBM Technical Disclosure Bulletin, "Effective Scheme for Utilizing Partially Good Chips in Memory System", G. G-C. Liu, Vol. 20, No. 8, January 1978, pp. 3009–3010.

4. IBM Technical Disclosure Bulletin, "Storage Module Reconfiguration to Bypass Bit Failures", W. G. Bouricius, W. C. Carter, J. P. Roth and P. R. Schneider, Vol. 11, No. 5, October 1968, pp. 550–551.

5. IBM Technical Disclosure Bulletin, "Processing System", R. P. Fletcher, Vol. 11, No. 5, October 1968, p. 515.

6. IBM Technical Disclosure Bulletin, "Error Correction by Reconfiguring", J. E. Heasley, Jr. and R. F. McMahon, Vol. 10, No. 10, March 1968, pp. 1543–1544.

7. IBM Technical Disclosure Bulletin, "Logical Deletion of Portions of a Push-Down Algorithm", E. L. Allen, Jr., V. L. Blunk, E. J. Ossolinski and H. G. Weber III, Vol. 12, No. 12, May 1970, pp. 2150–2151.

8. IBM Technical Disclosure Bulletin, "Removal of Failing Buffer sections in a Buffer-Backing Store". M. W. Bee, W. E. Boehner, J. L. Burk and B. L. McGilvray, Vol. 13, No. 2, July 1970, pp. 400–402.

SUMMARY OF THE INVENTION

It is a primary object of the present invention to improve the performance of the functional operation of the error correction and prevention apparatus of the prior art by connecting a small, but separate alternate memory, a bit steering array, to the main memory and storing the address of the auxiliary memory location, wherein the corrected data is stored, in the alternate memory.

It is a still further object of the present invention to connect the alternate memory to the main memory in a manner such that the alternate memory is addressed simultaneously with the main memory, the small size of the alternate memory permitting nearly immediate access to the corrected data stored in the auxiliary memory location.

In accordance with these and other objects of the present invention, when a read request is received by a memory unit, data is read from the memory unit and temporarily stored in an error correction matrix. In the matrix, the data is tested for existence of a single bit error or a double bit error.

Concurrently with the read request, a bit steering array is addressed to determine if part of the data, read from memory, should be read from a spare memory chip or from one of a plurality of memory chips designated for storage of the data. The bit steering array is very small relative to the memory unit, for example, the bit steering array may be approximately 288 cells in size whereas the memory unit may be approximately 75.5 million cells in size. If certain specific coded information is present in the bit steering array, one of the bits of the data read from memory is read from the spare memory chip.

If a single bit error exists in said data, and the bit steering array does not indicate that part of the data should be read from the spare memory chip, the error correction matrix corrects the bit in error. The data is then transmitted to a processor for further processing. However, if a double bit error exists in said data, and the bit steering array does not indicate that part of the data should be read from the spare memory chip, the error correction matrix cannot correct the two bits in error because it is not capable of determining which specific two bits are the erroneous bits. Therefore, the error correction matrix notifies a separate memory and the processor regarding the existence of the double bit error. The processor utilizes a program stored in the separate memory to determine the specific two bits constituting the double bit error. The processor updates the bit steering array to indicate the identity of one of the two bits constituting the double bit error. When the identity of the one of the two bits is determined, its location in storage in a spare memory chip is also determined. Furthermore, since the processor has identified the two specific bits constituting the double bit error, the processor corrects the two bits. When the processor writes the data into the memory unit, since the bit steering array has been updated, the one of the two bits is stored in the spare memory chip, and the other of the two bits, constituting the double bit error, is stored in its original location. The other remaining bits of the data are stored in their original locations. The double bit error has been reduced to a single bit error. When the data is again read from memory, the bit steering array is consulted. As a result, the one of the two bits is automatically withdrawn from the spare memory chip. The other erroneous bit is again withdrawn from its original location. A single bit error exists; however, the error correction matrix is capable of automatically correcting the single bit error.

As a result of the bit steering array, and the manner of its connection to the memory unit, during a subsequent read of the memory unit, at an address corresponding to the defective memory location within the memory unit, the corrected data is retrieved from the spare memory chip during a first read cycle, that is, when the memory unit is first read for the purpose of retrieving the corrected data. Therefore, contrary to the prior art, the original double bit error will never again re-occur. As a result, an improvement in the performance of the computer system of the prior art is noted. Furthermore, due to the small size of the bit steering array, relative to the memory unit, during the first read cycle, nearly immediate access is given to the corrected data stored in the spare memory chip. A further improved performance of the computer system of the present invention, relative to the computer system of the prior art, is noted.

Further scope of applicability of the present invention will become apparent from the detailed description given hereinafter. However, it should be understood that the detailed description and the specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

A full understanding of the present invention will be obtained from a reading of the detailed description given hereinbelow and the accompanying drawings, which are given by way of illustration only, and thus are not limitative of the present invention, and wherein.

DETAILED DESCRIPTION OF THE PREFERRED EMBODIMENT

Figure 1:
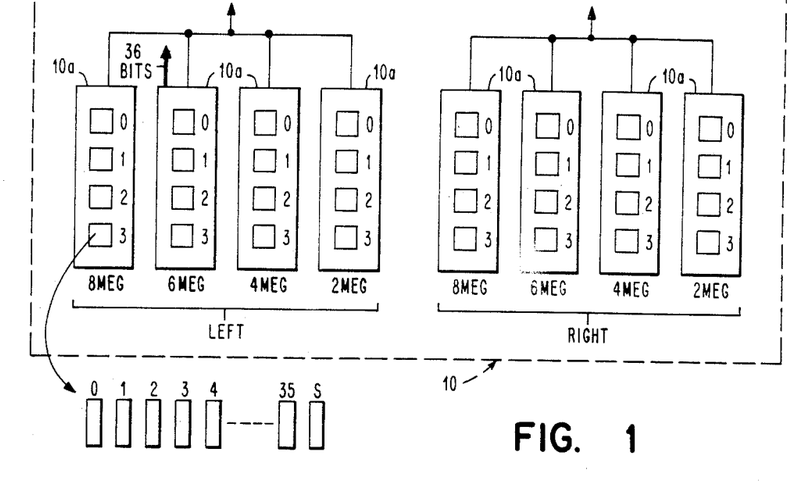
FIG. 1 illustrates a plurality of memory cards in the memory unit, each card comprising a plurality of memory groups, each group comprising a plurality of memory chips, each chip storing a portion of the data stored in the memory unit.

FIG. 1 illustrates a plurality of memory cards 10a disposed within a memory unit 10. In FIG. 1, a memory card 10a includes four groups of chips (groups 0 through 3). A group comprises, in the preferred embodiment, thirty-six (36) integrated circuit (I.C.) chips (0–35) and one spare chip (S). Each chip stores 64 K bits of data.

Figure 2:
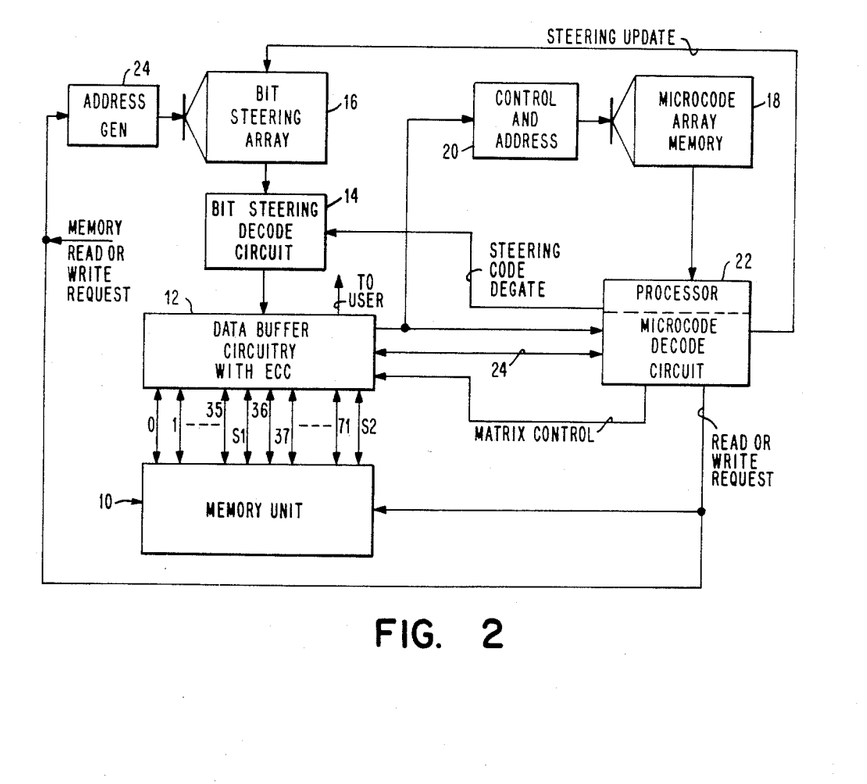
FIG. 2 illustrates the apparatus of the present invention for automatically detecting an error, in particular, a double bit error, for correcting the error, and for ensuring that said error will never again re-occur.

FIG. 2 illustrates an apparatus, according to the present invention, for automatically detecting the existence of defective portions of a memory chip, for correcting the data stored in the defective portions, and for ensuring that at least some of the defective portions of the memory chip will never again be used for the storage of data. In FIG. 2, each chip of each group of a memory card 10a disposed within the memory unit 10 is connected to a data buffer circuit 12 via a plurality of lines, labelled 0–35, 36–71 corresponding to chips 0–35 associated with a first memory card and a second memory card, and S1, S2 corresponding to the spare memory chip associated with the first memory card and the second memory card, respectively. The data buffer circuit 12 is connected to a bit steering array 16 via a bit steering decode circuit 14. The bit steering array 16 is approximately 288 cells in size whereas the memory unit 10 is approximately 75.5 million cells in size. The data buffer circuit 12 includes an error correction code matrix (ECC) for determining if a single bit error or a double bit error exists in the data read from memory unit 10, and for determining the identity of the bits in error when a double bit error is located. The bit steering array contains information relative to the operative condition of each chip of each group within each memory card 10a of the memory unit 10. The bit steering decode circuit 14 decodes the information stored in the bit steering array 16, the decoded information being used by the data buffer circuit 12 to steer corrected data for storage in the spare chip (S) of a particular group of a memory card in the memory unit 10.

The data buffer circuit 12 is connected to a microcode array memory 18 via a control and address circuit 20 and to a processor 22 (otherwise known as a microcode decode circuit). The memory 18 stores a program used for determining the specific bits which constitute a double bit error, and for correcting the specific bits. The processor 22 executes the instructions of the program stored in the microcode array memory 18. The processor 22 is connected to the bit steering array 16 for updating the array 16 to reflect the identity of one of the specific bits which constitute the double bit error, as determined by the processor 22 and the program stored in memory 18. The processor 22 is further connected to the bit steering decode circuit 14 via a steering code degate line for disabling the functioning of the bit steering array, to the data buffer circuitry 12 via a matrix control line for disabling the functioning of the error correction matrix, and to the memory unit 10 via a read/write request line.

When a memory read or write request is developed from an external source, the request is received by an address generator 24 connected to the bit steering array 16. The request is further received by the memory unit 10 wherein the data to be read is initially stored.

Figure 3:
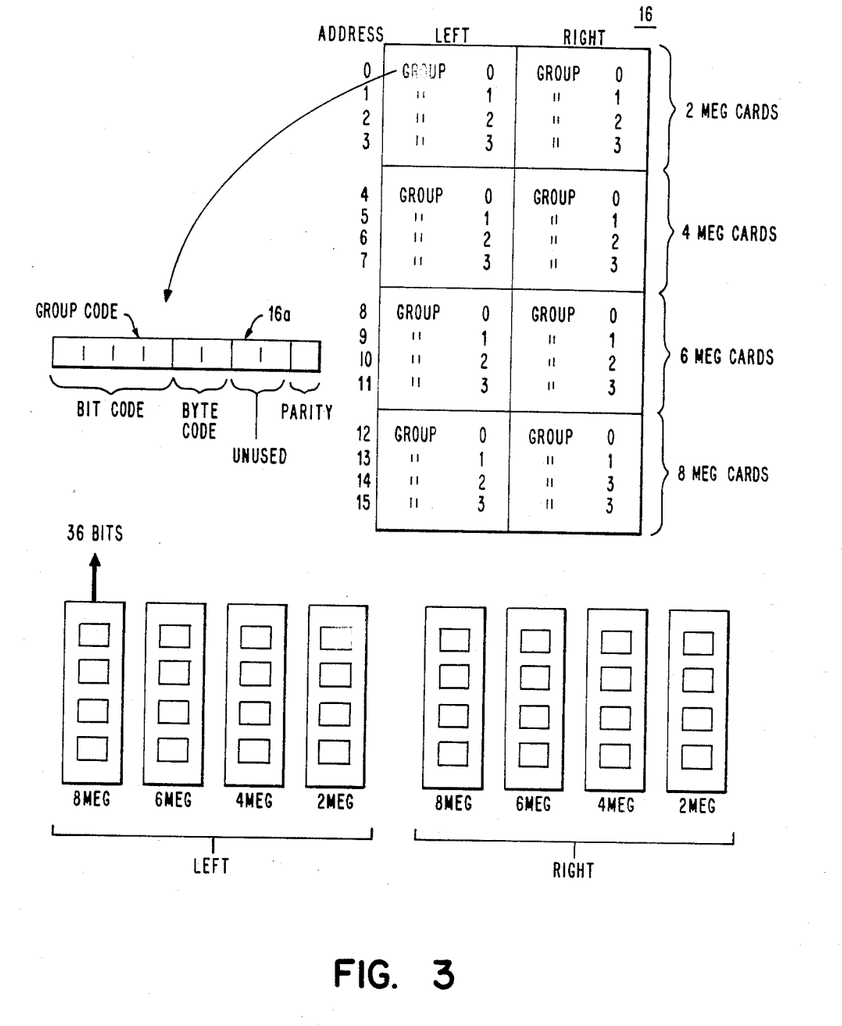
FIG. 3 illustrates the contents of the bit steering array, a portion of the apparatus of FIG. 2, for storing information relative to the operative condition of the integrated circuit (IC) chips comprising each group of a memory card within the memory unit.

FIG. 3 illustrates the contents of the bit steering array 16 of FIG. 2 which stores information relative to the operative condition of the individual cells associated with the memory chips comprising each group of the memory cards 10a within the memory unit 10. In FIG. 3, eight memory cards are illustrated, the left four cards are associated with the left portion of the bit steering array, the right four cards are associated with the right portion of the bit steering array. The information stored in the bit steering array 16 comprises a plurality of group codes 16a. Each group of each memory card has associated therewith a group code 16a stored in the bit steering array 16 (recall that, in the preferred embodiment, there are 36 memory chips per group). The group code comprises a bit code identifying the defective chip within a group of a memory card, a byte code identifying the byte of which the bit code and the defective memory chip is associated, and additional bits including a parity bit. The group codes 16a, associated with each group of a memory card, are stored in selected address locations of the bit steering array 16, the address locations being the same as the address locations of the corresponding chips associated with the group of the memory card 10a in memory unit 10 in which the corresponding data is stored.

Figure 4:
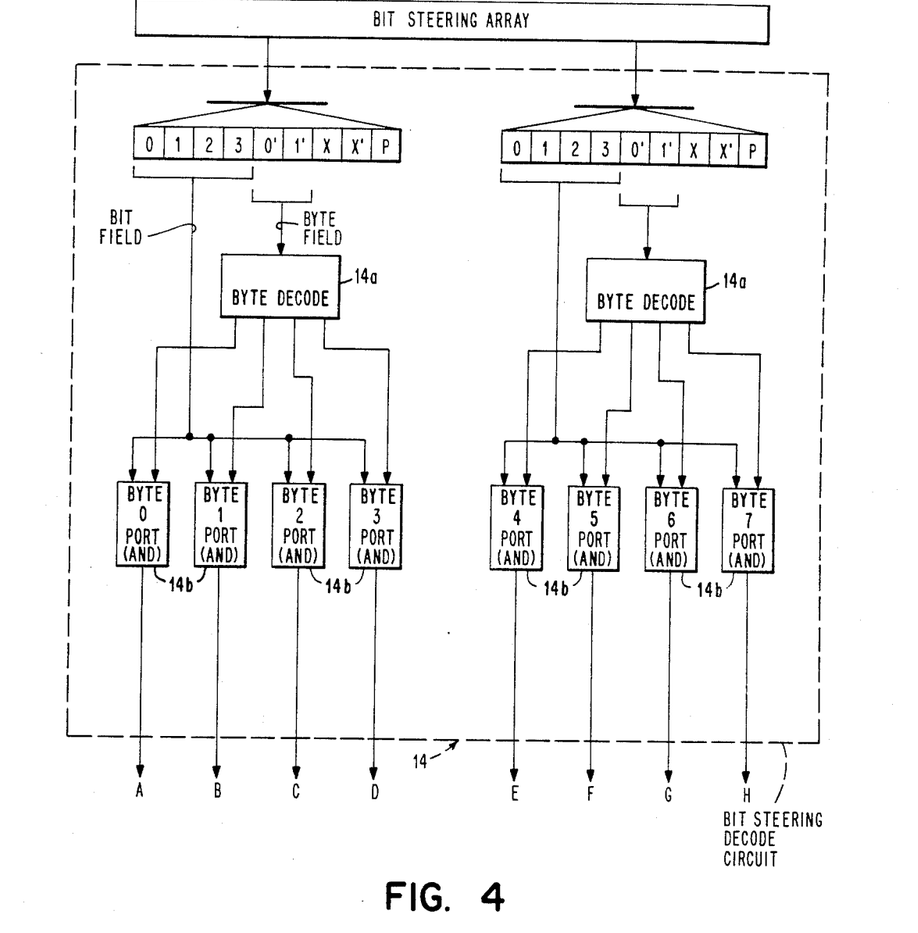
FIG. 4 illustrates the construction of the bit steering decode circuitry, a portion of the apparatus of, FIG. 2, for decoding the information stored in the bit steering array.

FIG. 4 illustrates the construction of the bit steering decode circuit 14 shown in FIG. 2 which is responsible for decoding the information stored in the bit steering array 16. The bit steering array 16 is connected to the bit steering decode circuit 14 so as to communicate the bit code and the byte code, associated with the selected group code, to the bit steering decode circuit 14. In FIG. 4, a pair of group codes are addressed in the bit steering array 16, the bit codes and bytes codes of which are transmitted to the bit steering decode circuit 14. A byte decode circuit 14a, disposed within the steering decode circuit 14, receives the bytes codes. The byte decode circuit 14a is connected to each of four AND gates 14b, otherwise known as byte ports, that is, byte 0 port, byte 1 port, byte 2 port, and byte 3 port. The bit code is provided as another input to each of the four AND gates 14b. Based on the received byte code, one of the four AND gates 14b (or byte ports) is selected. Although each of the AND gates 14b are connected to the data buffering circuit 12, an output signal is generated from the one of the four AND gates 14b, representative of the received bit code. The output signal energizes the data buffering circuit 12, and is representative of a defective memory cell associated with a memory chip of a selected group on a memory card 10a disposed within the memory unit 10.

Figure 5:
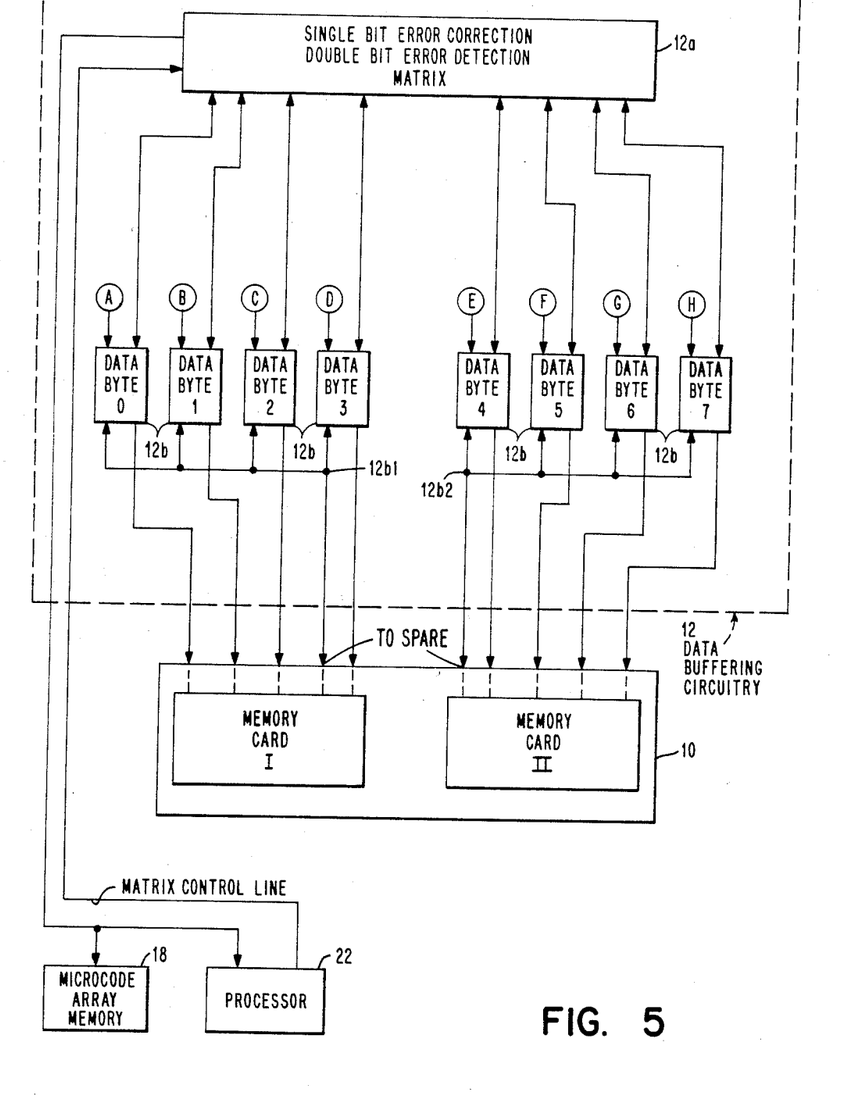
FIG. 5 illustrates the construction of the data buffering circuitry, a portion of the apparatus of FIG. 2, for receiving the data from the memory cards within the memory unit, detecting the existence of an error in said data, steering the corrected bits of said data to a spare portion of the memory unit, and steering the original correct bits of said data to their original storage locations within the memory unit.

FIG. 5 illustrates the construction of the data buffering circuit 12 of FIG. 2 responsible for receiving the data from the memory cards within the memory unit, detecting the existence of a single bit error or a double bit error, steering a corrected bit of said data to a spare portion of the memory cards, in the event the error is a double bit error, and steering the remaining bits of the data to their original storage locations within the memory cards. In FIG. 5, the data buffer circuit 12 comprises a single bit error correction/double bit error detection matrix 12a connected to the processor 22 (microcode decode circuit) and to the microcode array memory 18 via the control and address circuitry 20. The matrix 12a determines whether a single bit error or a double bit error exists in the data read from memory unit 10, corrects the erroneous bit in the event the error is a single bit error, and notifies the processor 22 and memory 18 of the existence of a double bit error in the event the error is a double bit error. The matrix 12a is not capable of determining which two bits of the data read from memory unit 10 constitute the double bit error. It therefore cannot correct the two bits.

The matrix 12a is connected to a plurality of latch circuits 12b, otherwise known as data byte 0, data byte 1, . . . , data byte 7. In the preferred embodiment, there are eight (8) latch circuits 12b, data byte 0 through data byte 7. The reason for this number of latch circuits 12b is as follows: In the preferred embodiment, there are thirty-six (36) memory chips per memory card 10a (plus one spare). The 36 chips may be divided into four (4) nine-chip groups. Therefore, for the first memory card 10a, there are four latch circuits 12b, data byte 0 through data byte 3. For the second memory card 10a, there are four latch circuits 12b, data byte 4 through data byte 7.

Each of the latch circuits 12b are also connected to a corresponding, respective output terminal of one of the AND gates (byte ports) 14b of FIG. 4. A first output terminal of each latch circuit 12b is connected to nine (9) consecutive memory chips within a group of a memory card 10a of the memory unit. A second output terminal of four latch circuits 12b is tied together to form a junction 12b1, the junction 12b1 being connected to the spare (S) memory chip within a memory card 10a of the memory unit 10. A second output terminal of four additional latch circuits 12b is tied together to form another junction 12b2, the junction 12b2 being connected to the spare (S) memory chip within another memory card 10a of the memory unit 10.

Figure 6A:
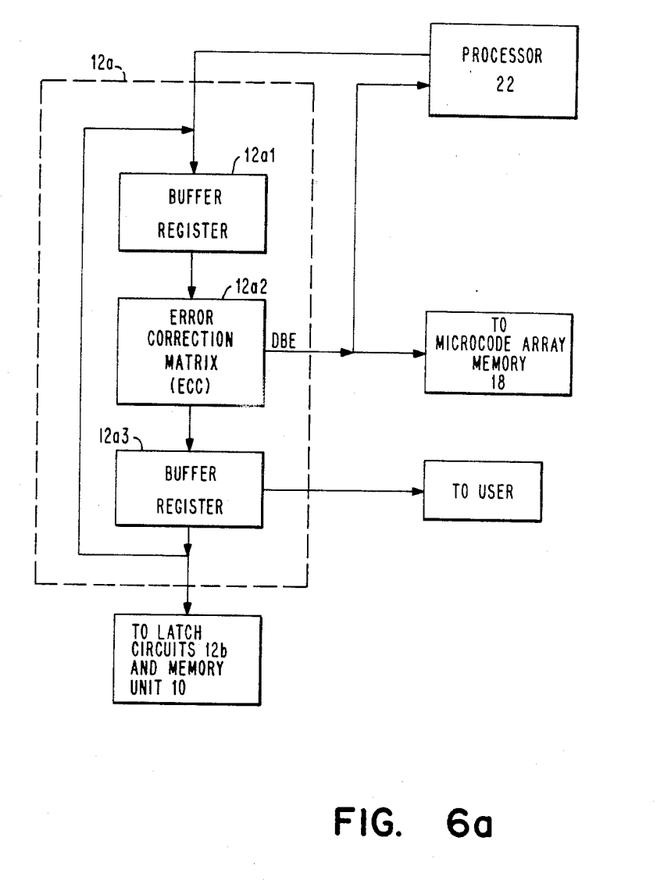
FIGS. 6a and 6b illustrate the construction of the single bit error correction/double bit error detection matrix shown in FIG. 5.
Figure 6B:
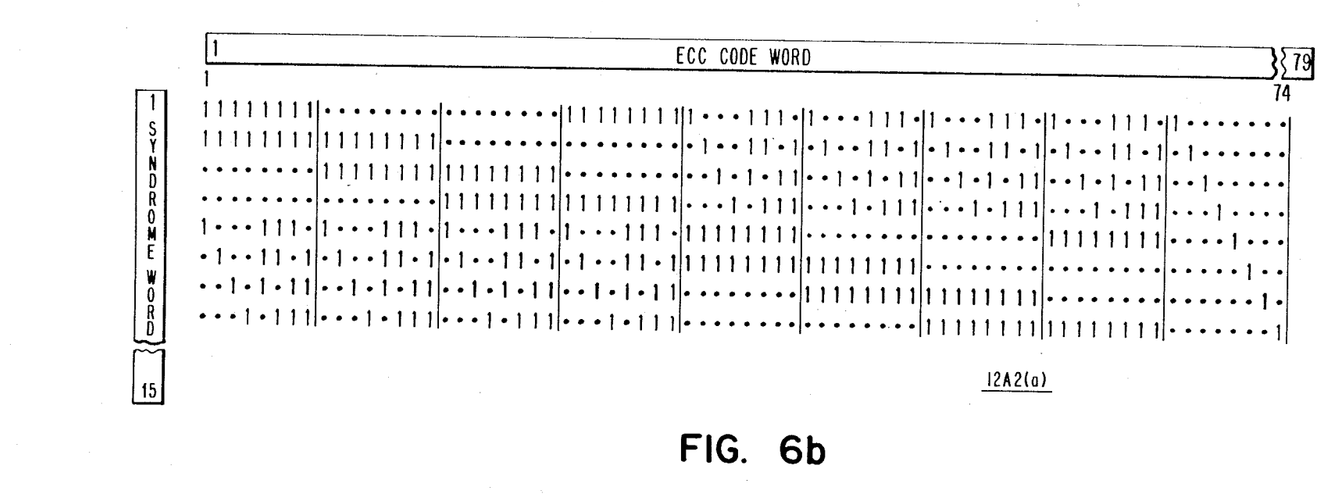

FIGS. 6a and 6b illustrate the construction of the single bit error correction/double bit error detection matrix 12a shown in FIG. 5. In FIG. 6a, the matrix 12a includes a buffer register 12a1, an error correction code matrix (ECC) 12a2 connected to the buffer register 12a1, and another buffer register 12a3 connected to the ECC matrix 12a2. Buffer register 12a1 receives an input from processor 22. The ECC matrix 12a2 is connected to processor 22 and to microcode array memory 18 for informing the processor 22 and the memory 18 of the existence of the double bit error. The buffer register 12a3 provides an output terminal to a user and an output terminal to latch circuits 12b and memory unit 10.

The ECC matrix 12a2 is a hardware implementation of a matrix similar to the matrix 12a2(a) shown in FIG. 6b. The matrix 12a2(a) comprises a plurality of rows, each row including a plurality of binary 1s and 0s stored therein. A space is reserved at the end of each row of the matrix for the storage of a check bit therein. A check bit is generated and stored in the space at the end of each row of the matrix in the following manner: data is read from memory unit 10; the data overlays each row of the matrix 12a2(a); a check bit 1 or check bit 0 is generated depending upon the combination of 1s and 0s in the row of the matrix and upon the combination of 1s and 0s in the data overlaying the row of the matrix; the check bit is stored in the space at the end of each row of the matrix. Since the combination of 1s and 0s in the rows of the matrix is always fixed, and since the combination of 1s and 0s in the data read from memory unit 10 varies depending upon the existence of a single bit or double bit error, the generated check bit for each row of the matrix represents the data overlaying said each row. The check bits are utilized to determine if an error in the data is a single bit error or a double bit error. The manner in which the check bits are so utilized will become apparent from a reading of the functional description of the invention in the paragraphs below.

Figure 7:
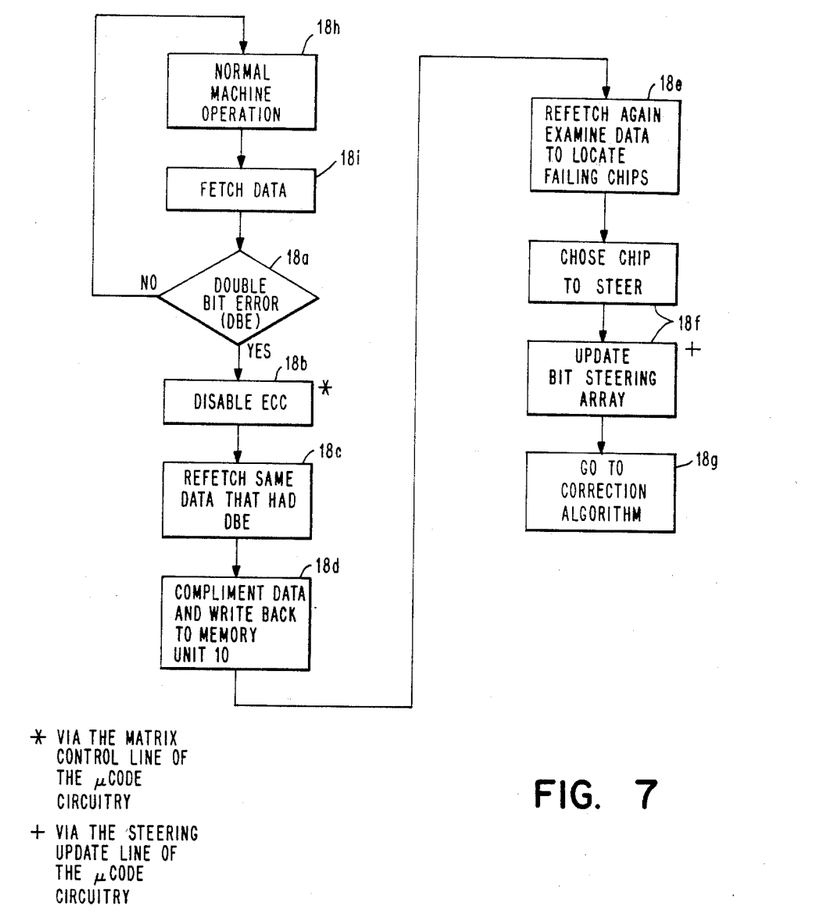
FIGS. 7 and 8 illustrate an algorithm representing a program stored in the microcode array memory, a portion of the apparatus of FIG. 2, for determining the defective cells in the chips of a group in a memory card, and for correcting the data stored in the defective cells.
Figure 8:
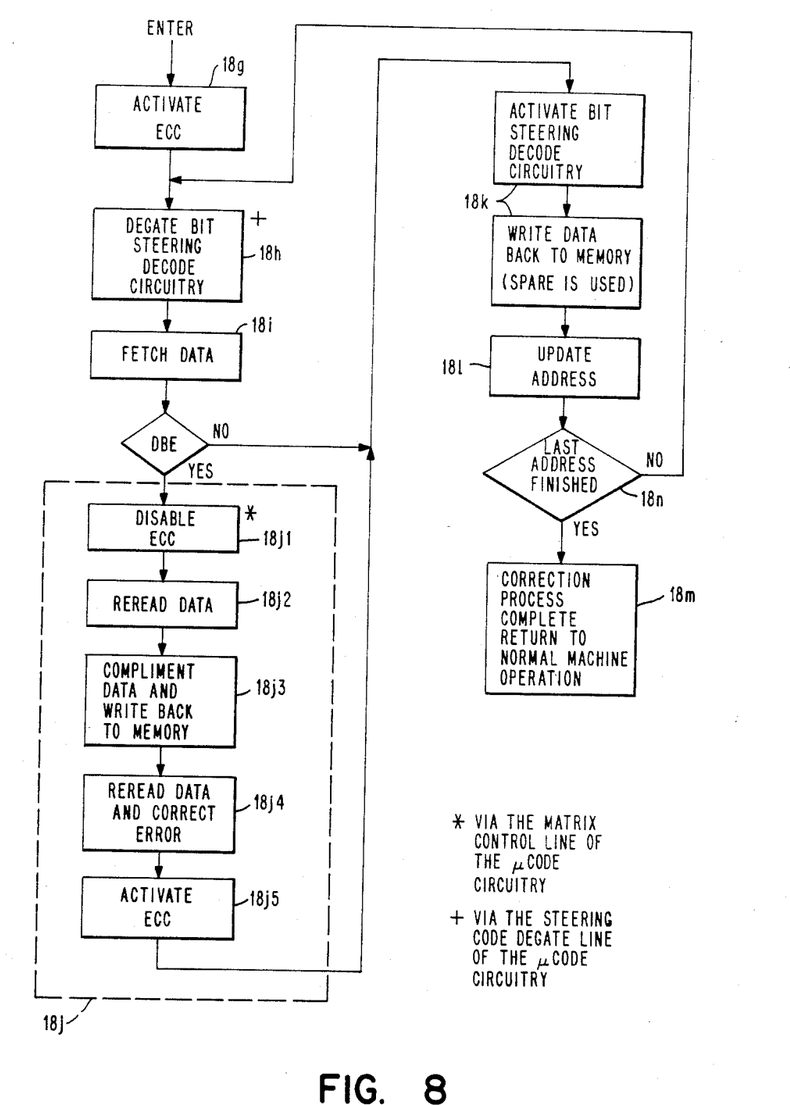

FIGS. 7 and 8 illustrate an algorithm representing the program stored in the microcode array memory 18 of FIG. 2 responsible for determining, with the assistance of processor 22, the specific bits in error in the event a double bit error is detected by the ECC matrix. When the specific bits in error are identified, the defective cells within the corresponding memory chips of a memory card are identified. The program in memory 18 is also responsible for correcting the data previously stored in the defective cells. FIGS. 7 and 8 will be discussed in detail below as a part of the description of the functional operation of the present invention.

The functional operation of the present invention will now be described in the following paragraphs with reference to FIGS. 1 through 8 of the drawings.

If processor 22 writes data into memory unit 10, the data is transmitted to the memory unit 10 via the error correction code (ECC) matrix 12a2. The data overlays each row of a matrix similar to matrix 12a2(a). The binary data in each row of the matrix is compared with the data being transmitted to the memory unit 10. In response to this comparison, a check bit is generated for each row of the matrix. For example, an 8-row matrix 12a2(a) shown in FIG. 6b results in a 8-binary bit check bit number associated with the data being written into memory unit 10. The 8-binary bit check bit number is stored with the data in memory unit 10.

In FIG. 2, a read request is received from an external source via the "memory read or write request" line shown in the figure. As a result of the read request, data, and its check bit number, is read from a group of each memory card 10a, a left card and a right card, within the memory unit 10 and is transmitted to the data buffer circuitry 12 via lines 0 through 71 shown in FIG. 2. As a result, the data, stored in memory chips 0 through 71 corresponding to two selected groups of two memory cards 10a, and their associated check bit numbers, is transmitted to the "single bit error correction/double bit error detection" matrix 12a of FIG. 5 via lines 0 through 71 of FIG. 2 and latch circuits 12b (e.g. data bytes 0 through 3 and 4 through 7) of FIG. 5. Referring to FIG. 6a, the data read from memory unit 10, and it associated check bit number, is transmitted to the error correction code (ECC) matrix 12a2 of matrix 12a via the buffer register 12a1 of matrix 12a. When the data enters the ECC matrix 12a2, it overlays each row of a matrix or grid similar to matrix 12a2(a) shown in FIG. 6b. The binary data read from memory unit 10 is compared with the binary data in each row of the matrix or grid (12a2(a)) and a check bit is generated associated with each row of the matrix or grid (12a2(a)). The generated check bits associated with each row of the matrix or grid (12a2(a)) are compared with the check bit number read from memory with the data. As a result of the comparison of check bits, a determination is made regarding the presence of a single bit error or a double bit error in the data read from memory unit 10.

When the read request is received by the memory unit 10, via the "memory read or write request" line, a specific address of the memory unit 10 is interrogated for data. As mentioned above, in response to this addressing, the data stored in chips 0 through 71 of the selected group of a memory card is read therefrom. Concurrently with the addressing of memory unit 10, the bit steering array 16 is addressed at the same address location corresponding to the specific address location of the memory unit 10. A group code 16a is read from the bit steering array 16 and is transmitted to the bit steering decode circuit 14. The byte code of the group code is received by the byte decode circuit 14a. The byte decode circuit 14a decodes the byte code, and, based on said code, generates an output signal energizing one of the AND gates (byte ports) 14b. The bit code of the group code read from the bit steering array 16 is a four bit binary number and may designate one of the memory cells associated with a memory chip as being a defective cell. A bit code of 1111 would indicate that none of the memory cells, associated with any of the memory chips from which the data was withdrawn, are defective. The bit code energizes each of the AND gates 14b, and, if a memory cell is defective, an output signal is generated from one of the AND gates 14b. Assume that the bit codes are 1111. An output signal is not generated from any of the AND gates 14b. Therefore, latch circuits 12b are not energized by any of the output signals from AND gates 14b. As a result, all of the data, withdrawn from memory unit 10, is read from memory chips 0 through 35 associated with one memory card and memory chips 0 through 35 associated with the other memory card, that is, none of the data is read from the spare memory chips (S1 and S2).

If the error correction code (ECC) matrix 12a2 determines that a single bit error is present in the data withdrawn from memory unit 10 (only one bit appears to be erroneous), the matrix 12a2 corrects the erroneous bit associated with the single bit error, and either transmits the corrected data to buffer register 12a3 and to the user or transmits the corrected data to the processor 22 for further processing.

However, if the error correction code matrix 12a2 determines that a double bit error is present in the data withdrawn from memory unit 10 (two bits appear to be erroneous), the matrix 12a2 generates an output signal energizing memory 18 and processor 22 informing the processor 22 of the existence of the double bit error in the data withdrawn from memory unit 10. The processor 22 executes a program stored in memory 18, the program being represented by the flow charts illustrated in FIGS. 7 and 8 of the drawings.

Referring to FIG. 7, if the ECC matrix 12a2 determines that a double bit error exists (block 18a), the processor 22 disables the ECC matrix 12a2 via the "matrix control line", block 18b. The processor 22 re-reads the data from memory unit 10, block 18c, the data being transmitted to processor 22 via line 24 shown in FIG. 2. The processor 22 compliments the data and stores the data in its original locations within memory unit 10, block 18d. The processor 22 again re-reads the data from memory unit 10. The re-read complimented data is compared with the data originally re-read from memory unit 10, and the two erroneous bits constituting the double bit error are determined, block 18e. When the two erroneous bits are determined, the two memory cells, in which the bits were stored, are also determined. The processor 22 updates the bit steering array 16, block 18f, via the "steering update" line of FIG. 2, to reflect the identity of only one of the two defective cells (the bit code of the group code 16a is updated to to identify the selected defective cell). At this point, the double bit error has been reduced to a single bit error; and, as previously mentioned, the error correction code (ECC) matrix 12a2 is capable of correcting single bit errors as indicated by block 18g. If the ECC matrix 12a2 determines that a double bit error does not exist, the system returns to normal machine operation, block 18h, and new data is fetched, block 18i.

Referring to FIG. 8, as indicated by block 18g, the processor 22 activates the ECC matrix 12a2, and degates the bit steering decode circuitry 14, as indicated by block 18h. The data is again re-read from memory unit 10, block 18i. If a double bit error still exists (since the bit steering array has been disabled, the double bit error which originally existed should still exist), as indicated by block 18j of FIG. 8, the processor 22 again disables the ECC matrix 12a2, block 18j1, re-reads the data from memory unit 10, block 18j2, compliments the data and stores the data into memory unit 10, 18j3, re-reads the data again from memory unit 10, determines the two erroneous bits associated with the double bit error, corrects the two erroneous bits, 18j4, and activates the ECC matrix 12a2 block 18j5. As indicated by block 18k, the processor 22 activates the bit steering decode circuitry 14 and stores the data into memory unit 10 via the buffer register 12a1, ECC matrix 12a2, buffer register 12a3, and latch circuits 12b. However, since the the ECC matrix 12a2 has been activated and the bit steering array 16 has been activated, check bits are generated associated with the data written into memory unit 10 and the updated bit code of the group code 16a instructs the latch circuits 12b to store one of the two erroneous bits in the data, associated with the double bit error, in a spare (S) memory chip. The remaining bits of the data are stored in their original locations of memory unit 10. At this point, the double bit error has been reduced to a single bit error. The ECC matrix is capable of correcting the erroneous bit associated with a single bit error. The address is updated, block 18L. If the last address is finished, the correction process is complete; the system returns to normal machine operation, block 18m. If the last address is not finished, block 18n, the system degates the bit steering decode circuitry, block 18h.

Assume that the same data, originally read from memory unit 10 and possessing the double bit error, is again re-read from the memory unit 10. As indicated above, the original double bit error has been reduced to a single bit error. One of the bits associated with the double bit error has been corrected and stored in the spare (S) memory chip whereas the other bit has been restored into its original location in memory unit 10 (in one of the two defective cells in memory which caused the double bit error). When the same data is re-read, either by processor 22 or by an external source, the bit steering array 16 is interrogated at an address corresponding to the address location of data in memory unit 10. A group code 16a is read from the bit steering array 16. This particular group code has already been updated, as indicated in the above paragraphs, to indicate that one of the bits of data in this address location has been stored in a spare (S) memory chip. The bit code associated with the group code read from the bit steering array 16 energizes the AND gates 14b. The byte code energizes the byte decode circuit 14a, of FIG. 4. One of the AND gates 14b is energized by an output signal generated from the byte decode circuit 14a. As a result, an output signal is generated from one of the AND gates 14b (byte 0 port, byte 1 port, byte 2 port, or byte 3 port) and from one of the AND gates 14b (byte 4 port, byte 5 port, byte 6 port, or byte 7 port). Assume that output signals C and G are generated from AND gates 14b, as shown in FIG. 4. Output signal C energizes latch circuit 12b (data byte 2) and output signal G energizes latch circuit 12b (data byte 6). Recall that output signal C and output signal G actually comprise the bit codes from their respective group codes, a bit code identifying a particular cell in a memory chip as being defective. Since the bit codes associated with output signals C and G energize their respective latch circuits 12b, when the data is re-read from memory unit 10, one of the bits associated with the original double bit error is withdrawn from the spare (S) memory chip. As a result, when the data (and its corresponding check bits) is read from memory unit 10, it is transmitted to the error correction code matrix 12a2, via the buffer register 12a1, associated the "single bit error correction/double bit error detection" matrix 12a. The data read from memory unit 10 overlays each row of a matrix similar to matrix 12a2(a) shown in FIG. 6b. Each of the bits of the data is compared with each of the bits in each row of the matrix. As a result of this comparison, a check bit is generated for each row of the matrix. The generated check bits are compared with the check bits read from memory unit 10 with the data. A comparison of the check bits reveals the presence of a single bit error in the data read from memory unit 10. The error correction code matrix 12a2 corrects the single bit error. The re-read data, corrected to eliminate the single bit error, is available for use by processor 22 or by the user.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A system for correcting errors in stored data and for maintaining the correct condition of said data including a memory unit means responsive to a memory unit means read or write request signal for storing data and corrected data, said data being stored in a plurality of memory chips, said corrected data being stored in a plurality of spare memory chips, and error detection and correction means connected to the memory unit means for detecting the existence of errors in said data stored in said plurality of memory chips and for correcting the erroneous data stored in said memory chips, comprising:

error identity recording means connected to and physically separate from said memory unit means, connected to said error detection and correction means and responsive to said memory unit means read or write request signal energizing said memory unit means for storing a plurality of addresses therein indicative of a corresponding plurality of locations within said memory unit means wherein said erroneous data is stored.

2. The system of claim 1, wherein said error detection and correction means:

determines the addresses in said memory unit means wherein said erroneous data is stored;

records at least some of said addresses, associated with said erroneous data, in said error identity recording means;

corrects said erroneous data;

stores the corrected data, corresponding to said at least some of said addresses recorded in said error identity recording means, in said spare memory chips; and stores the corrected data, corresponding to the remainder of said addresses of said erroneous data, in said plurality of memory chips.

3. The system of claim 2, further comprising:

means for generating said memory unit means read or write request signal, said memory unit means and said error identity recording means simultaneously receiving said memory unit means read or write request signal.

4. The system of claim 3, wherein said memory unit means read or write request signal represents an incoming read request simultaneously energizing said memory unit means and said error identity recording means for reading data stored at a particular address of said memory unit means, said error identity recording means comparing said particular address of said incoming read request with said plurality of addresses stored within said recording means and developing an output signal when said particular address matches one of said plurality of addresses stored in said recording means.

5. The system of claim 4, further comprising:

decoding means connected to said error identity recording means and responsive to said output signal developed therefrom representative of said particular address for decoding said particular address thereby determining the identity of an erroneous bit stored in said memory unit means associated with said particular address and for developing an output signal indicative of said identity of said erroneous bit.

6. The system of claim 5, further comprising:

data buffer means connected to said decoding means and responsive to said output signal from said decoding means, connected to said plurality of memory chips and to said spare memory chips within said memory unit means, and connected to said error detection and correction means for receiving said data stored in said plurality of memory chips, including said erroneous bit stored in said memory unit means at said particular address, and for receiving said corrected data stored in one of said spare memory chips in response to said memory unit means read or write request signal, said data buffer means exchanging said erroneous bit with said corrected data in response to said output signal from said decoding means and developing an output signal indicative of said data previously stored in said plurality of memory chips with said erroneous bit replaced by said corrected data.

7. The system of claim 1, further comprising:

means for generating said memory unit means read or write request signal, said memory unit means and said error identity recording means simultaneously receiving said memory unit means read or write request signal.

8. A system for correcting a double bit error in data stored in a memory unit, said memory unit including a plurality of memory chips for storing said data including said double bit error and a spare memory chip for storing a corrected data bit, comprising:

first means responsive to a memory unit addressing signal for storing an address therein representative of an address in said memory unit wherein at least one bit of said double bit error is stored and for developing an output signal representative of said address in response to said memory unit addressing signal; and second means responsive to said memory unit addressing signal for reading said data, including said double bit error, from said plurality of memory chips of said memory unit and for reading said corrected data bit from said spare memory chip, said second means exchanging one of the bits of said double bit error read from one of said plurality of memory chips with said corrected data bit read from said spare memory chip in response to said output signal from said first means thereby producing data having a single bit error, said single bit error representing the other of the bits of said double bit error; and error correction matrix means connected to said first means and responsive to said data produced by said first means for receiving said data having said single bit error and for correcting said single bit error thereby producing data having no errors.

9. A method of identifying a set defective bits associated with a double bit error in a set of data read from a memory and of utilizing an address in said memory corresponding to at least one of said defective bits to ensure that said double bit error will not re-occur when said data is subsequently read from said memory, comprising the steps of:

complementing the data read from said memory;

re-storing the complemented data in said memory;

re-reading the re-stored, complemented data from said memory;

comparing the re-stored, complemented data re-read from said memory with the complemented data re-stored in said memory thereby identifying the defective bits which constitute the double bit error;

updating a bit steering array to record said address in said memory corresponding to at least one of the defective bits which constitutes said double bit error, said bit steering array being physically separate from said memory;

re-storing a corected bit corresponding to said at least one of the defective bits in a spare memory chip of said memory while re-storing the bits of said set of data, including the other one of the defective bits, in a plurality of memory chips of said memory in accordance with said address recorded in said bit steering array;

simultaneously addressing said bit steering array and said memory;

re-reading said corrected bit corresponding to said at least one of the defective bits from said spare memory chip and the bits of said set of data, including the other one of the defective bits, from the plurality of memory chips in response to the addressing of said memory; and exchanging said corrected bit re-read from said spare memory chip with said other one of the defective bits re-read from said plurality of memory chips in response to the addressing of said bit steering array thereby reducing said double bit error to a single bit error and ensuring that said double bit error does not re-occur.

* * * * *